United States Patent
Machado

(10) Patent No.: US 7,301,356 B2
(45) Date of Patent: Nov. 27, 2007

(54) SUPPORT FOR A RECEPTACLE BLOCK OF A UNIT UNDER TEST

(75) Inventor: John Machado, Folsom, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 81 days.

(21) Appl. No.: 10/975,728

(22) Filed: Oct. 28, 2004

(65) Prior Publication Data

US 2006/0097739 A1   May 11, 2006

(51) Int. Cl.
*G01R 31/02* (2006.01)

(52) U.S. Cl. .................. 324/755; 439/310
(58) Field of Classification Search ............ None
See application file for complete search history.

(56) References Cited

U.S. PATENT DOCUMENTS

| | | | | |
|---|---|---|---|---|
| 4,410,222 A * | 10/1983 | Enomoto et al. | ......... | 439/157 |
| 5,419,711 A * | 5/1995 | Noro et al. | ......... | 439/310 |
| 5,467,023 A * | 11/1995 | Takeyama | ......... | 324/754 |
| 5,582,523 A * | 12/1996 | Noro et al. | ......... | 439/310 |
| 5,627,473 A * | 5/1997 | Takani | ......... | 324/538 |
| 6,066,957 A | 5/2000 | Van Loan et al. | | |
| 6,116,935 A * | 9/2000 | Fukuda | ......... | 439/310 |
| 6,257,911 B1 | 7/2001 | Shelby et al. | | |
| 6,268,719 B1 | 7/2001 | Swart | | |
| 6,316,951 B1 * | 11/2001 | Chiyoda | ......... | 324/754 |
| 6,509,752 B1 | 1/2003 | O'Keeffe et al. | | |
| 6,731,118 B2 * | 5/2004 | Nishino et al. | ......... | 324/538 |
| 2006/0189211 A1 * | 8/2006 | Lang et al. | ......... | 439/607 |

* cited by examiner

*Primary Examiner*—Ha Tran Nguyen
*Assistant Examiner*—Richard Isla-Rodas

(57) ABSTRACT

Apparatuses and methods for supporting a receptacle block in a device testing a unit under test. The unit under test includes the receptacle block, which has one or more receptacles electrically coupled to components of the unit under test. A support includes a plurality of supporting surfaces that are respectively positioned at different depths. A positioning mechanism positions the support behind a receptacle block.

27 Claims, 3 Drawing Sheets

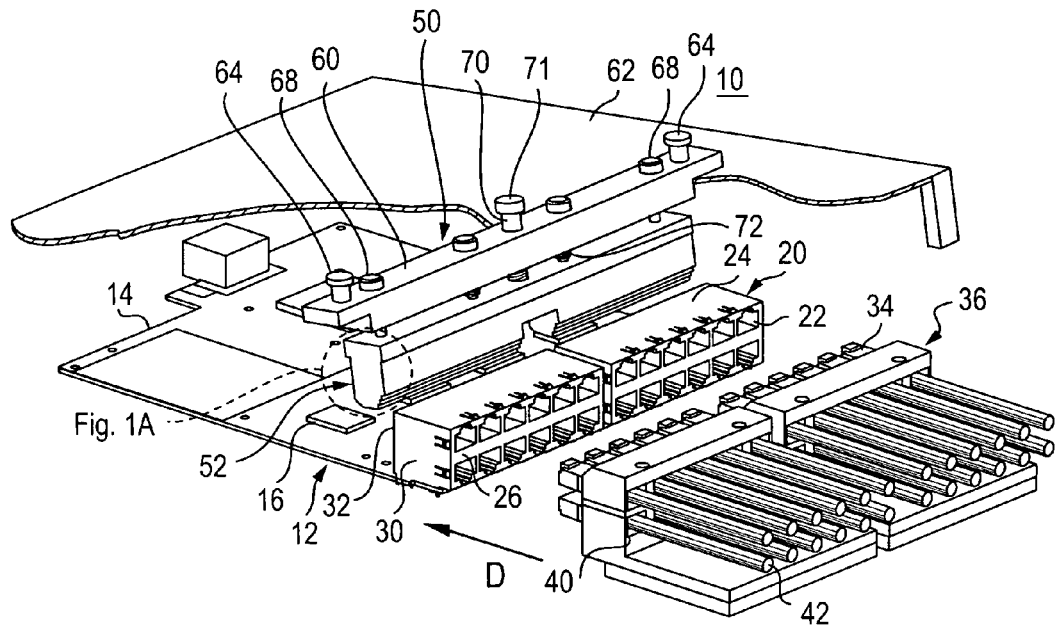
Fig. 1A
Fig. 1
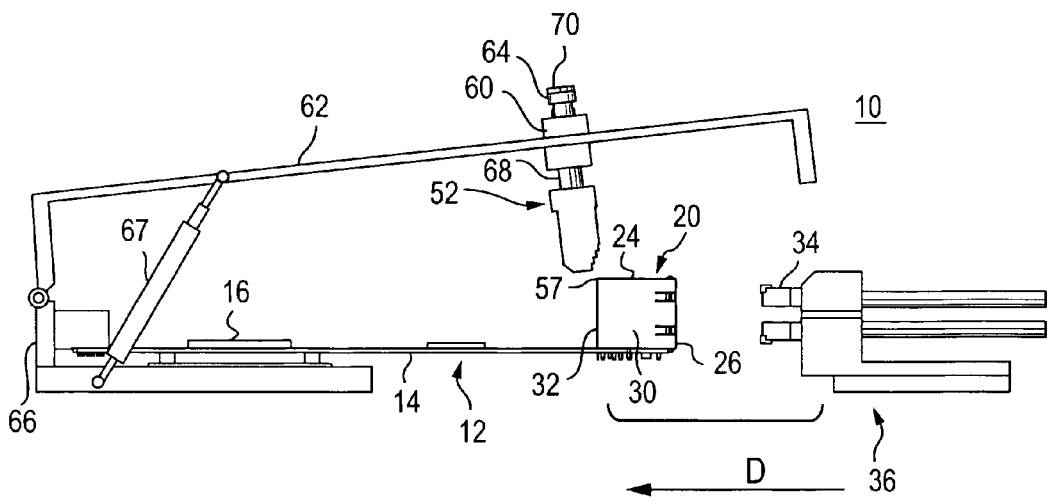
Fig. 2

SUPPORT FOR A RECEPTACLE BLOCK OF A UNIT UNDER TEST

BACKGROUND OF THE INVENTION

The present invention relates generally to testing and/or manufacturing.

A Functional Circuit Test (FCT) assesses a unit under test such as a printed circuit board assembly (PCBA). Typically, the unit under test is placed within a test fixture and connected to one or more testing circuits via electrical connectors. PCBAs usually include at least one receptacle block mounted thereon. The receptacle block contains one or more receptacles that engage the electrical connectors. The receptacles are coupled to components on the PCBA that are tested during the FCT.

Automated or manually operated systems urge the connectors toward and into the receptacle block so that an FCT can be conducted. To support and hold one or usually multiple electrical connectors, a typical test fixture includes a connector holder block. The system moves the connector holder block toward the PCBA so that the connectors enter the connector receptacle block simultaneously and engage the receptacles to enable the functional test of the PCBA.

When the connectors are inserted into the receptacle block in this manner, however, significant forces are applied to the receptacle block. The receptacle block typically deflects because of these insertion forces. Such deflection, especially if the connector block moves too great a distance toward the receptacle block, leads to stress in the PCBA and the electrical components that are mounted on it.

A common approach to address this problem employs a support that is moved into place behind the receptacle block. The support limits deflection and prevents over-stressing of the circuit board.

The test fixture may be configured so that the support, when placed in position behind the receptacle block, has a fixed location. This makes automatic positioning of the support easier. However, dimensional variability among different receptacle blocks creates concerns with this approach. If the receptacle block depth is smaller than that for which the support is configured, the support may be positioned too far back to provide needed support. Excessive deflection and stress to the PCBA may occur, leading to damage of the printed circuit board or components of the PCBA. If the connector block depth is greater than the connector block for which the support is configured, the support may interfere with the connector block as the support is moved into place, which may damage the PCBA or the PCBA-mounted receptacle block.

To accommodate different PCBA structures, a testing facility may need to readjust the position of the support each time production and testing change from one PCBA configuration to another. If the readjustment of conventional supports is not made when testing different PCBA configurations, the supports may be set with too much space between the support and the receptacle block, allowing too much deflection before providing support and preventing damage to the PCBA. Alternatively, if the conventional support is set too close to the receptacle block, and a too-large receptacle block is tested, interference between the support and the receptacle block may occur when the support block is moved into position. Such corrective readjustment, however, increases testing and production costs, and the amount of adjustment necessary may not be feasible in some instances.

SUMMARY OF THE INVENTION

A preferred embodiment of the present invention provides an apparatus for supporting a receptacle block in a device testing a unit under test. The unit under test includes the receptacle block, which has one or more receptacles electrically coupled to components of the unit under test. The device has at least one connector that moves toward the receptacle block and engages the receptacles. The apparatus comprises a support including a plurality of supporting surfaces respectively positioned at different depths. The apparatus also comprises a positioning mechanism for positioning the support behind the receptacle block.

BRIEF DESCRIPTION OF THE DRAWINGS

FIG. 1 is a perspective view of a printed circuit board assembly (PCBA) and a portion of a test fixture including a support according to an embodiment of the present invention;

FIG. 2 is a side view of the PCBA and test fixture shown in FIG. 1;

DETAILED DESCRIPTION

Figure 3:
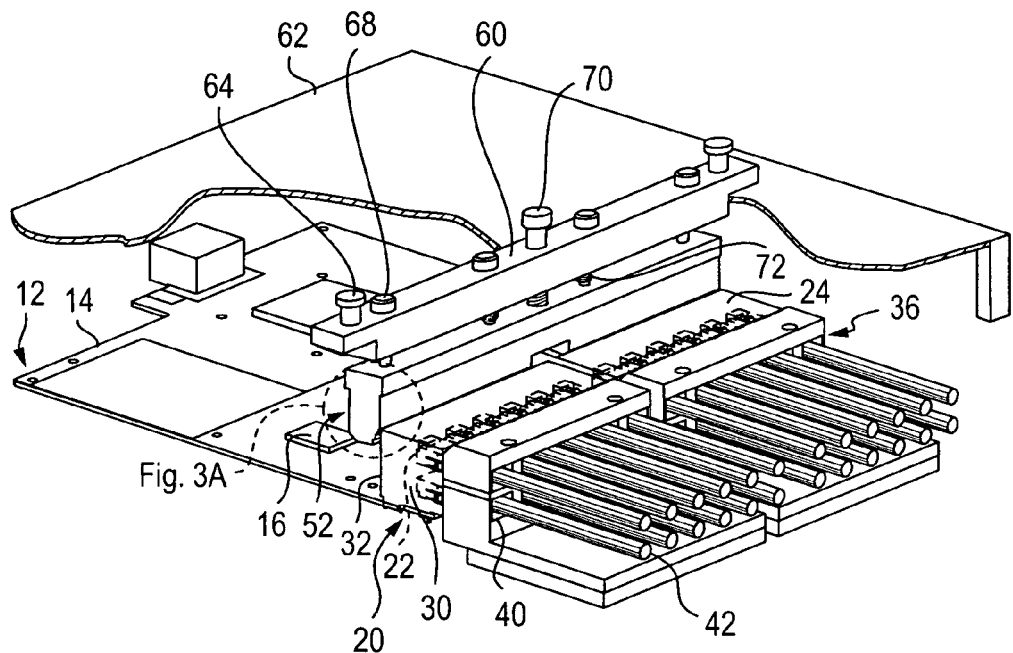
FIG. 3 is a perspective view of the PCBA and test fixture of FIGS. 1 and 2, with the connector holder mechanism engaged with the PCBA, according to an embodiment of the present invention.
Figure 3A:
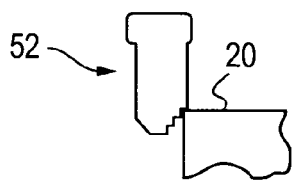

The concern of accommodating different PCBA structures for testing will be appreciated by those of ordinary skill in the art. One way of addressing dimensional variability is to only test PCBAs having a single particular structure or configuration. In this way, dimensional variability of the receptacle block is reduced. The problem with this approach, however, is that it limits the universe of available PCBAs for use. This in turn may limit component availability and price competition when procuring new boards.

Yet another compensation method is to insert the connectors using manual methods. For example, each connector may be inserted individually or in small groups. If a small number of connectors are inserted at any one time, the force applied to the PCBA is reduced, and no support may be required. However, inserting only a few connectors at a time increases manufacturing testing costs by increasing the test time, increasing the complexity of the testing fixture, and/or increasing the manufacturing cost of the product.

A preferred embodiment of the present invention provides an apparatus for supporting a receptacle block in a device testing a unit under test. The unit under test includes the receptacle block, which has one or more receptacles electrically coupled to components of the unit under test. The device has at least one connector that moves toward the receptacle block and engages the receptacles. The apparatus comprises a support including a plurality of supporting surfaces respectively positioned at different depths. The apparatus also comprises a positioning mechanism for positioning the support behind the receptacle block.

In preferred embodiments of the present invention, the receptacle block is mounted to a unit under test such as a printed circuit board assembly (PCBA). The receptacle block experiences a mechanical load due to forces from receiving one or more connectors. To support the receptacle block, the support preferably is moved into position behind the receptacle block prior to the insertion of the connectors, and it supports the receptacle block when the receptacle block receives the connectors.

The plurality of supporting surfaces preferably are respectively positioned at different depths to accommodate varying depths of connector receptacle blocks. The connectors moving toward and into the receptacle block cause at least part of the receptacle block to move in the direction of insertion of the connectors. A supporting surface preferably engages a surface or edge of the receptacle block and resists movement of the receptacle block in the direction of insertion of the connectors, limiting deflection of the receptacle block.

In a preferred embodiment, the support is stepped to accommodate various depths of the receptacle block. For example, the support may include a plurality of steps respectively positioned at a different depth. Each step has a supporting surface for engaging the receptacle block. Further, a preferred support is mounted so that it can be lowered into engagement with the receptacle block by a positioning mechanism to enable automatic positioning of the support behind the receptacle block. The support preferably is moved into position by lowering the support until it engages the receptacle block. For example, a substantially horizontal surface of one of the steps may engage an upper surface of the receptacle block. The particular step that engages the receptacle block depends on the depth of the receptacle block. This contact halts movement of the support, and places the support into position. A supporting surface, which preferably is part of the step adjacent to and below the horizontal surface, is positioned behind the receptacle block. Other types of supports and supporting surfaces are contemplated.

Differently-sized receptacle blocks respectively engage with different supporting surfaces. Accordingly, a preferred support can limit the deflection of the receptacle block due to the forces of inserting one or more connectors. The preferred support automatically accommodates different sizes of receptacle blocks, preferably without needing to manually re-adjust the mounting position of the support block.

Another preferred embodiment provides a fixture for testing a unit under test. The unit under test includes a receptacle block having one or more receptacles electrically coupled to components of the unit under test. The fixture comprises one or more connectors electrically coupled to testing circuits for testing the unit under test. An actuator selectively moves the connector(s) toward the receptacle block, preferably a set distance. The fixture further includes a support for supporting the receptacle block. The support comprises a plurality of supporting surfaces respectively positioned at different depths. A positioning mechanism positions the support behind the receptacle block.

Yet another preferred embodiment provides a method of testing a printed circuit board assembly. The printed circuit board assembly includes a receptacle block having one or more receptacles electrically coupled to components of the unit under test. The printed circuit board is placed into a test fixture. A support is lowered into a position behind the receptacle block. As the support is lowered, a supporting surface of the support is positioned behind the receptacle block. One or more connectors are urged toward the receptacle block so that the connectors enter and engage the receptacles to make an electrical connection with one or more testing circuits. This deflects the receptacle block until the supporting surface engages the receptacle block, inhibiting further deflection of the receptacle block. The circuit test of the printed circuit board may then be conducted using the testing circuits.

Referring now to the figures, FIGS. 1 and 2 show a test fixture 10 for testing a unit under test, such as a printed circuit board assembly (PCBA) 12. The PCBA 12, which includes a printed circuit board 14 and components 16 thereon to be tested, is retained within the test fixture 10 by a suitable device. A receptacle block 20 perpendicularly mounted to the PCBA 12 includes a plurality of connector receptacles 22, which are electrically coupled to the components 16 of the PCBA 12. The receptacles 22 are preferably arranged in an array, which may be one or more dimensions. In the PCBA 12 shown in FIGS. 1-2, two rows of twelve receptacles 22 are shown, which extend from the front surface 26 rearward in a depth direction D.

The exemplary receptacle block 20 is rectangular, having outer surfaces including an exposed horizontal top surface 24, a vertical front surface 26, vertical side surfaces 30, and a vertical rear surface 32. The terms "vertical" and "horizontal" as used herein are with respect to the orientation shown in FIGS. 1-5. The receptacle block 20 is mechanically and electrically coupled to the substrate 14 in an appropriate manner. Typically, the physical connection is at the bottom of the receptacle block 20, and thus the top surface 24 is at a distal end. The receptacle block 20 may have a shape other than a completely rectangular shape, however.

Connectors 34 are provided for electrically coupling testing circuits (not shown) to the PCBA 12. The connectors 34 are preferably held by a holder mechanism 36, which also moves the connectors into engagement with the receptacles 22. In an exemplary embodiment, the holder mechanism 36 includes a holder block having a plurality of slots 40 extending through the block for supporting the connectors 34. Conductive paths such as cables 42 extending through the slots 40 electrically couple the connectors 34 to the testing circuits. The connectors 34 may be, as one non-limiting example, RJ45 connectors. The slots 40 of the holder mechanism 36 are aligned with the receptacles 22 in the receptacle block 20, so that multiple connectors 34 engage the receptacles simultaneously.

To conduct an FCT, an actuator such as a cam (not shown) preferably moves the holder mechanism 36 with the connectors 34 in the direction D toward the receptacles 22. The connectors 34 enter the receptacles 22 and engage terminals in the receptacles, making an electrical connection. Other actuators are possible including, but not limited to, pneumatic actuators. The FCT can then be conducted. Details for conducting an FCT are known to those of ordinary skill in the art.

Figure 4:
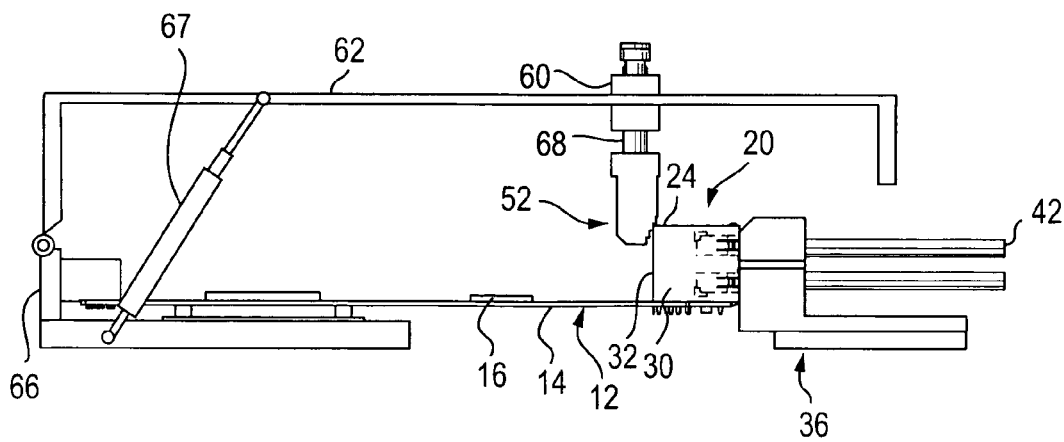
FIG. 4 is a side view of the engaged PCBA and test fixture portion shown in FIG. 3.

If the connectors 34 are moved too far toward the receptacle block 20 (in the direction D) by operation of the actuator, the receptacle block may be deflected too far backward, which can damage the receptacle block and/or bow the printed circuit board 14, causing even more significant damage. To address this concern, a support 52 is provided that is positioned behind the receptacle block 20, as shown in FIGS. 3-4. The support 52 may be positioned behind the receptacle block 20 using any suitable method that allows the support to move behind the receptacle block and remain in position. However, it is preferred that the support 52 is lowered into position behind the receptacle block 20. In this way, a process for positioning the support 52 behind the receptacle block 20 can be automated more easily.

The support 52 preferably includes a plurality of supporting surfaces that are positioned respectively at different depths, to accommodate varying depths of the receptacle block 20. For example, as shown in FIG. 1, the support 52 may include a block (one-piece or multiple pieces) that is stepped to accommodate varying receptacle block depths. Particularly, the exemplary support 52 has a plurality of steps 54 positioned respectively at different depths and heights. The steps 54 in the preferred support 52 together form a slope resembling an inverted staircase. Lower steps 54 are positioned further back in the direction D to accommodate greater depths of the receptacle block 20. Conversely, higher steps 54 are positioned further forward to accommodate smaller depths of the receptacle block 20. The support 52 preferably is made of a material or materials having sufficient stiffness to provide support to the receptacle block 20. The steps 54 may be machined from a block (single or multiple pieces) to produce the support 52, as a non-limiting example.

Each of the steps 54 preferably has at least one supporting surface 56, which in the exemplary stepped block 52 is substantially vertical. One or more of the supporting surfaces 56 preferably supports the receptacle block 20 by abutting the receptacle block at its rear surface 32, typically at a top rear edge 57 where the rear surface meets the top surface 24. This occurs when the support 52 is moved directly behind the receptacle block 20, and/or when the receptacle block is deflected backward in response to insertion force of the connectors 34 so that the rear surface or top rear edge 57 engages the supporting surface 56.

Because each of the plurality of supporting surfaces 56 has a different position along the direction D, the supporting surfaces respectively accommodate varying depths of receptacle blocks. By using a constant spacing along direction D between respective supporting surfaces 56, such as by spacing the steps 54 at constant intervals, a maximum amount of allowable movement in the direction D (i.e. backward deflection) is defined by the receptacle block 24 before the receptacle block 20 abuts the supporting surface. For example, if two adjacent supporting surfaces 56 have depth positions that are spaced apart by 1 mm, then the top of the receptacle block 20 can move backward a distance of up to 1 mm before the rear surface 32 or the top rear edge 57 engages one of the supporting surfaces. Put another way, receptacle blocks of different positions along the depth direction preferably engage different ones of the steps 54, respectively. Thus, though the support 52 may be stated to be moved "behind" the receptacle block 20, a portion of the support may not be completely behind the receptacle block, as seen most clearly in FIG. 4.

As described above, the support 52 preferably is lowered into position behind the receptacle block 20 before conducting an FCT. If so, a substantially horizontal surface 58 of one or more of the steps 54 preferably engages the top surface 24 or the top rear edge 57 of the receptacle block 20 as the support 52 is lowered into position. For rectangular steps 54, the depth of a particular horizontal surface 58 equals the spacing between adjacent vertical supporting surfaces 56. When the horizontal surface 58 contacts the top surface 24 or the top rear edge 57 of the receptacle block 20, the next-lower supporting surface 56 is in position to support the receptacle block 20 at the rear surface 32 or the top rear edge. In this way, the preferred support 52 can remain in a constant planar position yet accommodate varying depths (and heights) of the receptacle block 20 by varying only the height position of the support.

Figure 5:
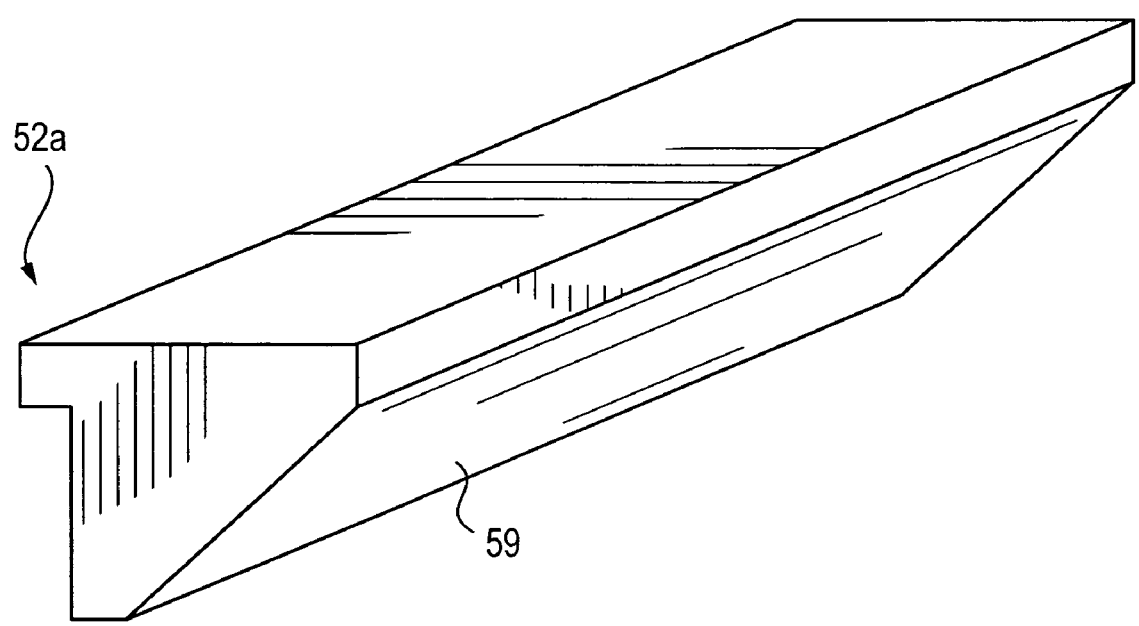
FIG. 5 is a perspective view of an alternative support having a flat angled surface according to another embodiment of the present invention.

As shown in FIG. 5, it is also contemplated that a support block 52a, instead of having discrete supporting surfaces 56 such as parts of steps, may have a more continuous slope, for example, a flat or substantially flat angled surface 59. The multiple supporting surfaces are provided by portions of the angled surface 59 at various positions along the surface in the depth direction D. If the surface 59 is configured so that higher positions are farther forward, as shown in FIG. 5, the support block 52a can accommodate varying depths of receptacle blocks as well. In this way, when the support block 52a is moved into position behind the receptacle block 20, the receptacle block engages a contact point on the angled surface 59 that is also a supporting surface. The angled surface 59 substantially reduces or prevents the receptacle block 20 from deflecting backward after engagement. Other embodiments of the support having multiple supporting surfaces are possible, such as multiple supporting surfaces or portions of an overall angled surface that are shaped between a flat surface and a rectangular step (angled or non-rectangular steps, toothed or rounded protrusions, ridges, etc.) and these are intended to be within the spirit and scope of the present invention.

The support 52, 52a can be positioned behind the receptacle block 20 in various ways. In a preferred embodiment, the support 52, 52a is positioned by a positioning mechanism that maintains a substantially constant planar position of the support, but allows the support to be lowered into position behind the receptacle block 20 until it engages the receptacle block. The term "positioning mechanism" is intended to broadly refer to any suitable automatic or manual device, apparatus, or system for moving the support 52, 52a (or other support according to embodiments of the invention) into a position behind the receptacle block 20 (though "behind", as previously stated, may or may not be completely behind the receptacle block). The positioning mechanism may operate alone or in combination with another device, apparatus, or system. An exemplary positioning mechanism includes a member mounted to a positioner of the text fixture 10. More preferably, the support 52, 52a is slidingly or pivotally connected to the member. The positioner, with the attached member, can be raised or lowered in any suitable manner, including automatic or manual methods.

In an exemplary embodiment, the positioning mechanism includes a member for mounting the support 52, 52a such as a bracket 60. For example, the bracket 60 may be rigidly mounted to a part of the test fixture 10, such as to a lid 62 of the test fixture that is lowered onto the PCBA 12 before beginning the FCT. The bracket 60 may be fixed to the lid 62 of the test fixture 10, for example by using bolts 64 that extend through the bracket and into the lid. The lid 62 may be movably (for example, pivotally) connected to other parts of the test fixture 10, such as a frame 66. The bracket 60 may be disposed, for example, within an opening of the lid 62.

An actuator, for example a pneumatic actuator 67, may be provided to lower and/or raise the lid 62, though other suitable automatic or manual methods or devices may be used, including, but not limited to, a hydraulic device, a mechanical device, etc. In an exemplary embodiment the bracket 60, preferably being rigidly mounted to the lid 62, moves with the lid, so that the bracket moves downward (preferably, as the test fixture 10 is shown in FIGS. 1-2). Also, because the bracket 60 preferably is rigidly mounted to the lid 62, it preferably has a fixed location along a plane parallel to the PCBA 12 when the lid is lowered into its position.

The support 52, 52a preferably is slidingly connected to the bracket 60 by a sliding mechanism, which in an exemplary embodiment includes one or more pins 68 that slide through holes in the bracket and are secured to a portion of the support. The pins 68, for example, may be permanently pressed into the support 52, 52a. The support 52, 52a is thus free to slide away from or toward the bracket 60 by sliding movement of the pins 68 to raise or lower the support. A substantially centrally (laterally) disposed shoulder bolt 70 preferably also slidingly connects the bracket 60 and the support 52, 52a, but also includes a head 71 disposed above the bracket to prevent complete separation between the bracket and the support. In an exemplary embodiment, the shoulder bolt 70 is secured to the support 52, 52a by being screwed into a threaded hole in the support.

Preferably, the sliding mechanism also includes a biasing mechanism such as one or more springs 72 disposed around one or more of the pins 68, as shown in FIG. 1, and/or around the shoulder bolt 70. The biasing mechanism biases the support 52, 52a toward the receptacle block 20. In a preferred embodiment, for example, the spring 72 biases the support 52, 52a away from the bracket 60 and thus in the downward direction when the lid 62 is lowered into position. However, the biasing mechanism also permits the support 52, 52a to cease moving at or after engagement with the receptacle block 20. For example, the spring 72 compresses to permit the support 52, 52a to stop moving downward when the support engages the receptacle block, such as when in particular embodiments, the horizontal surface 58 of the stepped support 52 engages the top surface 24 or the top rear edge 57 of the receptacle block 20. The support 52, 52a maintains its position behind the receptacle block 20 via the biasing mechanism. Other types of biasing mechanisms (fluid, magnets, etc.) are possible. Alternatively, the spring 72 may be removed from the sliding mechanism, so that the support 52, 52a slidingly separates from the bracket 60 due to gravity and the support rests in place.

In an exemplary operation, the PCBA 12 is placed and secured within the test fixture 10, and the lid 62 is lowered through operation of an actuator. The bracket 60, rigidly mounted to the lid 62, moves with the lid downward a set distance, and the support 52, 52a slidingly connected to the bracket moves downward as well. As the lid 62 and the support 52, 52a are lowered, preferably, the horizontal surface 58 engages the top surface 24 or the top rear edge 57 of the receptacle block, causing the support to cease moving downward. The support 52, 52a slides along the pin 68 toward the bracket as the lid 62 continues moving downward. The spring 72 compresses (if one is present), and the support 52, 52a, now spring-loaded, is retained against the receptacle block 20.

In an alternative embodiment, a support having a plurality of supporting surfaces may be positioned behind the receptacle block 20 by a positioning mechanism that directly pivots. The support, for example, may be incorporated in or rigidly mounted to a pivoting arm. The pivoting arm or support mounted thereto includes a plurality of supporting surfaces 56 (steps, a continuous slope, etc.) respectively varying in depth. For example, the supporting surfaces may be formed into the arm or a piece rigidly mounted to the arm.

The arm may be located within the test fixture 10 so that one or more of the supporting surfaces 56 can be pivoted to a position behind the receptacle block 20. For example, the arm may be pivotally coupled to a base that is rigidly mounted to a portion of the test fixture 10 and weighted to pivot downwardly by gravity until the support engages the receptacle block 20. Alternatively or additionally, the arm may have a separate pivoting actuator, which may, for example, be integrated with opening or closing of the lid 62 (e.g., coupled by a suitable linkage to the actuator or to the lid itself such that lowering of the lid also lowers (pivots) the arm).

It is contemplated that a biasing mechanism, such as a spring, fluid, magnet, etc, may be used to bias the support toward the receptacle block 20 and substantially maintain a position of at least one of the supporting surfaces 56 behind the receptacle block 20. The supporting surface 56 supports the receptacle block 20 as described above.

To test the PCBA, an actuator of the test fixture 10 moves the holder mechanism 36 and the connectors 34 toward the receptacle block 20 in the direction D, preferably a set distance. When the connectors 34 are inserted into the receptacle block 20, the receptacle block, especially toward its top, deflects backward. As the rear surface 32 and/or the top rear edge 57 moves backward when the receptacle block 20 deflects, it engages the supporting surface 56 of the support 52, 52a. Because the positioning mechanism substantially maintains the position of the support 52, 52a behind the receptacle block 20, the support substantially reduces or prevents further backward movement of the receptacle block. With the connectors 34 and the receptacles 22 engaged, the FCT is conducted.

Preferred embodiments of a support for a receptacle block have been shown and described, which include several advantages. Positional adjustments to the support preferably are not necessary to accommodate PCBA-mounted connector receptacle blocks that have varying size dimensions. The support preferably self-adjusts to the specific depth dimension of the receptacle block by positioning a supporting surface behind the receptacle block, yet provides needed support to limit deflection of the receptacle block and reduce or prevent damage to the PCBA.

If the support is stepped, the deflection of the PCBA-mounted receptacle block preferably is limited to the size of the separation along the depth direction of the steps of the support. This provides more consistent support to limit the deflection of the PCBA-mounted connector receptacle block.

While various embodiments of the present invention have been shown and described, it should be understood that other modifications, substitutions, and alternatives are apparent to one of ordinary skill in the art. Such modifications, substitutions, and alternatives can be made without departing from the spirit and scope of the invention, which should be determined from the appended claims.

Various features of the present invention are set forth in the appended claims.

What is claimed is:

1. For a device testing a unit under test, an apparatus for supporting a receptacle block, the unit under test including the receptacle block, the receptacle block having one or more receptacles for electrically coupling to components of the unit under test, the device having at least one connector that moves toward the receptacle block and engages the receptacles, said apparatus comprising:

a support comprising a plurality of supporting surfaces respectively positioned at different depths;

a positioning mechanism for positioning said support behind the receptacle block at least while the at least one connector is not engaged with the one or more receptacles;

wherein said support comprises a plurality of steps respectively positioned at different depths and heights, each of the plurality of steps including at least one of the supporting surfaces.

2. The apparatus of claim 1 wherein the plurality of steps comprises at least three steps, and wherein the plurality of steps are respectively spaced at a substantially constant interval.

3. The apparatus of claim 1 wherein the supporting surfaces have a substantially vertical orientation.

4. The apparatus of claim 3 wherein each of the plurality of steps further comprise a substantially horizontal surface.

5. The apparatus of claim 4 wherein said positioning mechanism is configured to lower said support until at least one of the horizontal surfaces contacts the receptacle block.

6. The apparatus of claim 5 wherein the horizontal surface engages a top rear edge of the receptacle block when said support is in position.

7. The apparatus of claim 6 wherein when said support is in position, one of the at least one supporting surfaces is in position to engage the top rear edge of the receptacle block when the receptacle block is deflected in response to the connectors engaging receptacles of the receptacle block.

8. The apparatus of claim 5 wherein said positioning mechanism comprises a member rigidly mounted to a part of the device that moves at least partially in a downward direction so that the positioning mechanism moves with the part of the device.

9. The apparatus of claim 8 wherein said positioning mechanism further includes a sliding mechanism coupled to the member and to said support, wherein said support is slidingly coupled to the member.

10. The apparatus of claim 9 wherein the sliding mechanism comprises at least one pin, wherein the pin slides within the member.

11. The apparatus of claim 10 wherein said positioning mechanism further comprises a biasing mechanism disposed between the member and said support to bias said support in the downward direction.

12. The apparatus of claim 11 wherein said biasing mechanism comprises a spring disposed about one or more of the at least one pin.

13. The apparatus of claim 1 wherein said support comprises an angled surface, wherein the plurality of supporting surfaces are positioned respectively at various depths along the angled surface.

14. The apparatus of claim 1 wherein said support comprises an angled surface having at least one of angled steps, toothed protrusions, rounded protrusions and ridges.

15. The apparatus of claim 1 wherein said support comprises an arm pivotable to a position behind the receptacle block.

16. The apparatus of claim 15 wherein said positioning mechanism comprises a base pivotably coupled to said support and configured to be rigidly mounted to a portion of the device.

17. The apparatus of claim 1, wherein the receptacle block is mounted to a printed circuit board (PCB) that is retained in a fixed position by the device, and wherein said positioning mechanism positions said support without positioning the receptacle block.

18. The apparatus of claim 1, wherein said support comprises at least three separate supporting surfaces, and wherein the at least separate supporting surfaces progressively increase in depth and decrease in height when said support is positioned behind the receptacle block.

19. The apparatus of claim 1, wherein said positioning mechanism is configured and arranged to position said support behind the receptacle block without the at least one connector engaging the receptacles.

20. The apparatus of claim 1, wherein the receptacle block has a plurality of receptacles for engaging a plurality of connectors.

21. A fixture for use in testing a unit under test, the unit under test including a receptacle block having one or more receptacles for electrically coupling to components of the unit under test, the test fixture comprising:
at least one connector configured to electrically couple to testing circuits for testing the unit under test;
an actuator configured to selectively move the at least one connector toward the receptacle block;
a support for supporting the receptacle block, said support comprising a plurality of supporting surfaces that are positioned respectively at different depths;
a positioning mechanism for positioning said support behind the receptacle block before the at least one connector engages the one or more receptacles;
wherein said support comprises a plurality of steps respectively positioned at different depths and heights, each of the plurality of steps including at least one of the supporting surfaces;
wherein the supporting surfaces have a substantially vertical orientation;
wherein each of the plurality of steps further comprise a substantially horizontal surface;
wherein said positioning mechanism is configured to lower said support until at least one of the substantially horizontal surfaces contacts the receptacle block.

22. The fixture of claim 21 wherein said positioning mechanism comprises a member that moves at least partially in a downward direction.

23. The fixture of claim 22 wherein said positioning mechanism further includes a sliding mechanism coupled to the member and to said support, wherein said support is slidingly coupled to the member.

24. The fixture of claim 22 wherein said positioning mechanism further comprises a biasing mechanism disposed between the member and said support to bias said support in the downward direction.

25. The fixture of claim 24 wherein one of the substantially horizontal surfaces engages a top rear edge of the receptacle block when said support is in position.

26. For a device testing a unit under test, an apparatus for supporting a receptacle block, the unit under test including the receptacle block, the receptacle block having one or more receptacles for electrically coupling to components of the unit under test, the device having at least one connector that moves toward the receptacle block and engages the one or more receptacles, said apparatus comprising:
a support comprising a plurality of supporting surfaces respectively positioned at different depths;
means for positioning said support behind the receptacle block before the at least one connector engages the one or more receptacles;
wherein said support comprises a plurality of steps respectively positioned at different depths and heights, each of the plurality of steps including at least one of the supporting surfaces;
wherein each of the plurality of steps includes a vertical surface and a horizontal surface;
wherein said means for positioning is configured to lower said support until at least one of the horizontal surfaces of said support contacts the receptacle block.

27. The apparatus of claim 26 wherein said support comprises angle angled surface having at least one of angled steps, toothed protrusions, rounded protrusions and ridges.

* * * * *

UNITED STATES PATENT AND TRADEMARK OFFICE
CERTIFICATE OF CORRECTION

| | | |
|---|---|---|
| PATENT NO. | : 7,301,356 B2 | Page 1 of 1 |
| APPLICATION NO. | : 10/975728 | |
| DATED | : November 27, 2007 | |
| INVENTOR(S) | : John Machado | |

It is certified that error appears in the above-identified patent and that said Letters Patent is hereby corrected as shown below:

In column 10, line 64, in Claim 27, delete "angle" and insert -- an --, therefor.

Signed and Sealed this

Twenty-fourth Day of June, 2008

JON W. DUDAS
*Director of the United States Patent and Trademark Office*